(12) United States Patent  
Sasaki

(10) Patent No.: US 8,767,437 B2
(45) Date of Patent: Jul. 1, 2014

(54) NONVOLATILE SEMICONDUCTOR MEMORY DEVICE OPERATING STABLY AND METHOD OF CONTROL THEREIN

(75) Inventor: Takahiko Sasaki, Santa Clara, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 172 days.

(21) Appl. No.: 13/423,494

(22) Filed: Mar. 19, 2012

(65) Prior Publication Data

US 2012/0243295 A1    Sep. 27, 2012

(30) Foreign Application Priority Data

Mar. 25, 2011    (JP) ................................ P2011-068220

(51) Int. Cl.
*G11C 11/00*    (2006.01)
(52) U.S. Cl.
USPC ........................ 365/148; 365/163; 365/189.09
(58) Field of Classification Search
USPC ..................................... 365/148, 163, 189.09
See application file for complete search history.

(56) References Cited

U.S. PATENT DOCUMENTS

| 7,989,789 | B2 | 8/2011 | Toda | |
|---|---|---|---|---|
| 8,274,815 | B2 * | 9/2012 | Ichihara et al. | 365/148 |
| 8,451,645 | B2 * | 5/2013 | Yoon et al. | 365/148 |
| 2010/0118591 | A1 | 5/2010 | Sugibayashi | |
| 2011/0116300 | A1 * | 5/2011 | Maejima | 365/148 |
| 2011/0182109 | A1 * | 7/2011 | Ikeda et al. | 365/148 |

FOREIGN PATENT DOCUMENTS

WO    2008/120480 A1    10/2008

* cited by examiner

*Primary Examiner* — Connie Yoha
(74) *Attorney, Agent, or Firm* — Oblon, Spivak, McClelland, Maier & Neustadt, L.L.P.

(57) ABSTRACT

A nonvolatile semiconductor memory device comprises a memory cell array, a control circuit, a current limiting circuit and a current suppression circuit. The memory cell array has a first line, a second line, and a memory cell arranged therein, the memory cell being connected between the first line and the second line and including a variable resistance element. The control circuit is configured to apply, via the first line and the second line, a voltage required in operation of the memory cell. The current limiting circuit is connected to the first line and configured to limit a current flowing in the memory cell to a certain limit value. The current suppression circuit is configured connectable to the second line and configured to suppress a current flowing in the second line according to a kind of operation on the memory cell.

17 Claims, 7 Drawing Sheets

NONVOLATILE SEMICONDUCTOR MEMORY DEVICE OPERATING STABLY AND METHOD OF CONTROL THEREIN

CROSS-REFERENCE TO RELATED APPLICATIONS

This application is based upon and claims the benefit of priority from the prior Japanese Patent Application No. 2011-068220, filed on Mar. 25, 2011, the entire contents of which are incorporated herein by reference.

FIELD

The embodiments described herein relate to a nonvolatile semiconductor memory device and a method of control therein.

BACKGROUND

Description of the Related Art

Conventionally, a resistance varying type memory that uses a variable resistance element as a memory cell has been proposed. Known examples of a variable resistance element include a phase change memory element that changes its resistance value according to a change in crystalline/amorphous state of a chalcogenide compound, a MRAM element that uses resistance change due to a tunnel magnetoresistance effect, a polymeric ferroelectric RAM (PFRAM) memory element having a resistance element formed by a conductive polymer, a ReRAM element that has a resistance change caused by an electric pulse application, and so on.

Write of data to a memory cell in a so-called unipolar type element is performed by applying a certain setting voltage to the variable resistance element for a short time. This causes the variable resistance element to change from a high-resistance state to a low-resistance state. Hereinafter, this operation to change the variable resistance element from the high-resistance state to the low-resistance state is called a setting operation. On the other hand, erase of data from the memory cell in the so-called unipolar type element is performed by applying a resetting voltage to the variable resistance element for a long time, the resetting voltage being lower than the setting voltage applied during the setting operation, and the variable resistance element being in the low-resistance state after the setting operation. This causes the variable resistance element to change from the low-resistance state to the high-resistance state. Hereinafter, this operation to change the variable resistance element from the low-resistance state to the high-resistance state is called a resetting operation.

When performing the setting operation in this kind of resistance varying type memory, a cell current flowing in the memory cell after completion of the operation is substantially increased compared to before completion of the operation. If such a large current continues to flow, a memory cell that has once shifted to the low-resistance state may mistakenly returns again to the high-resistance state (mistaken resetting) or it may be destroyed.

DETAILED DESCRIPTION

A nonvolatile semiconductor memory device according to an embodiment comprises a memory cell array, a control circuit, a current limiting circuit and a current suppression circuit. The memory cell array has a first line, a second line, and a memory cell arranged therein, the memory cell being connected between the first line and the second line and including a variable resistance element. The control circuit is configured to apply, via the first line and the second line, a voltage required in operation of the memory cell. The current limiting circuit is connected to the first line and configured to limit a current flowing in the memory cell to a certain limit value. The current suppression circuit is configured connectable to the second line and configured to suppress a current flowing in the second line according to a kind of operation on the memory cell.

Embodiments are described below with reference to the accompanying drawings.

First Embodiment

[Overall Configuration]

Figure 1:
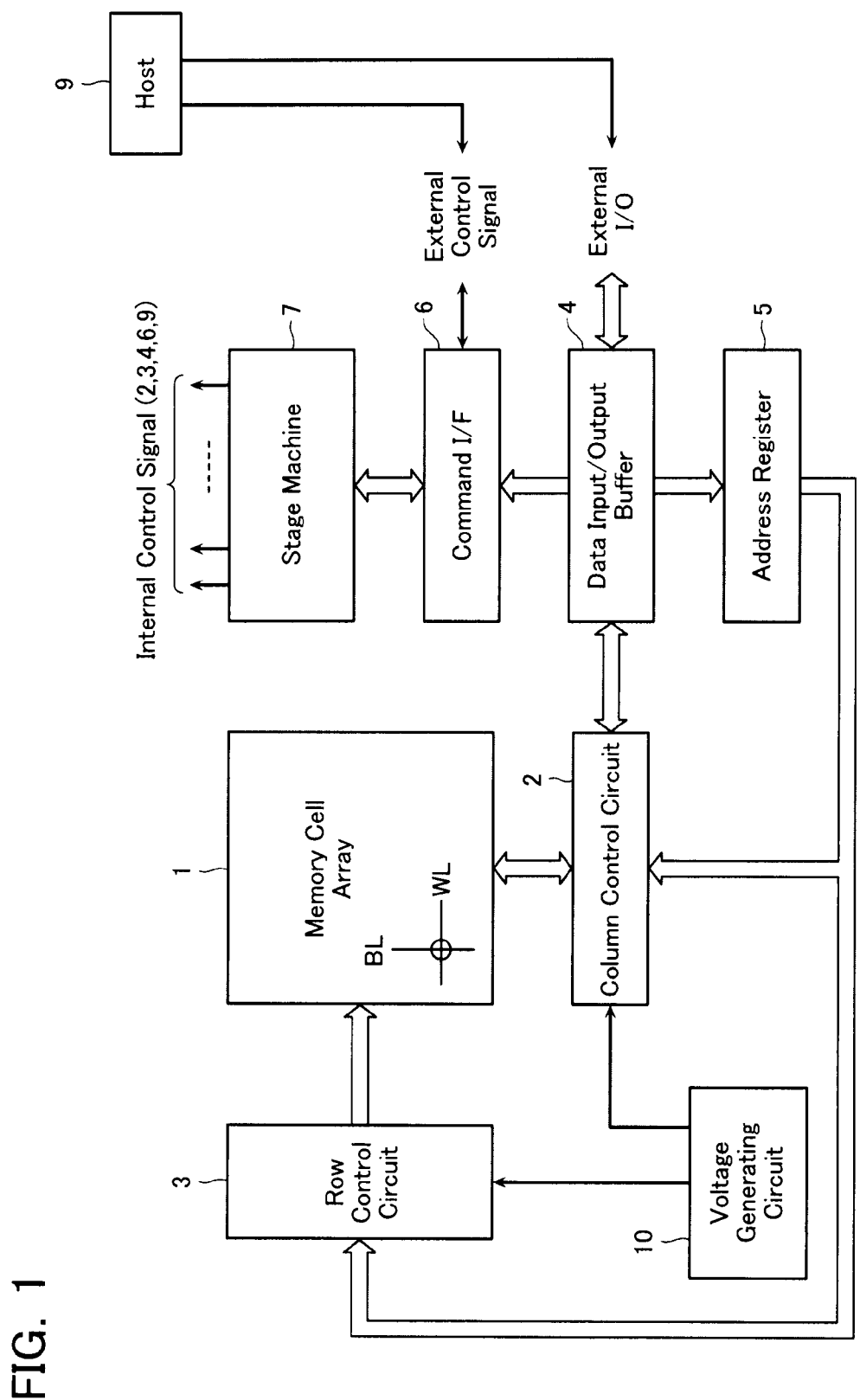
FIG. 1 is a block diagram showing a nonvolatile semiconductor memory device according to an embodiment of the present invention.

FIG. 1 is a block diagram of a nonvolatile memory according to a first embodiment of the present invention.

This nonvolatile memory comprises a memory cell array 1 in which memory cells, each using a variable resistance element, are disposed in a matrix.

A column control circuit 2 is provided at a position adjacent to the memory cell array 1 in a bit line BL direction. The column control circuit 2 controls voltages of bit lines BL of the memory cell array 1 to perform data erase of the memory cells, data write to the memory cells, and data read from the memory cells.

In addition, a row control circuit 3 is provided at a position adjacent to the memory cell array 1 in a word line WL direction. The row control circuit 3 selects word lines WL of the memory cell array 1 to apply voltages required in data erase of the memory cells, data write to the memory cells, and data read from the memory cells.

A data input/output buffer 4 is connected to an external host 9 via an I/O line to receive write data, to receive erase instructions, to output read data, and to receive address data and command data. The data input/output buffer 4 sends write data received from external to the column control circuit 2, and receives data read from the column control circuit 2 and outputs this read data to external. Addresses supplied to the data input/output buffer 4 from external are sent to the column control circuit 2 and the row control circuit 3 via an address register 5.

In addition, commands supplied to the data input/output buffer 4 from the host 9 are sent to a command interface 6. The command interface 6 receives an external control signal from the host 9 to judge whether data inputted to the data input/output buffer 4 is write data, a command, or an address, and, if the data is a command, receives the data and transfers the data to a state machine 7 as a command signal.

The state machine 7 manages this nonvolatile memory overall, receiving commands from the host 9 via the command interface 6 to perform management of read, write, erase, input/output of data, and so on.

In addition, status information managed by the state machine 7 may also be received by the external host 9 to allow judgment of an operation result to be made. Moreover, this status information is employed also in control of write and erase.

Furthermore, the state machine 7 performs control of a voltage generating circuit 10. This control enables the voltage generating circuit 10 to output a pulse of any voltage with any timing.

The pulse formed herein may be transferred to any line selected by the column control circuit 2 and the row control circuit 3. Note that peripheral circuit elements other than the memory cell array 1 may be formed in a Si substrate directly below the memory cell array 1 formed in a wiring layer, whereby chip area of this nonvolatile memory may be made substantially equal to area of the memory cell array 1.

[Memory Cell Array and Peripheral Circuit Thereof]

Figure 2:
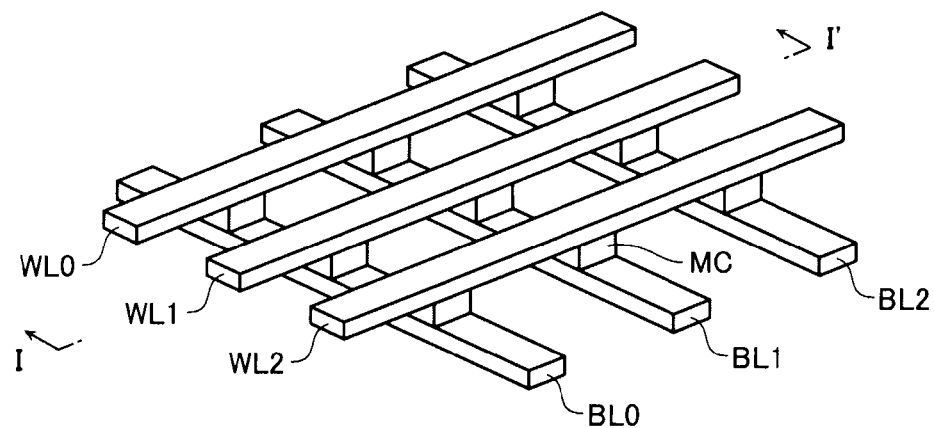
FIG. 2 is a perspective view of part of a memory cell array 1.
Figure 3:
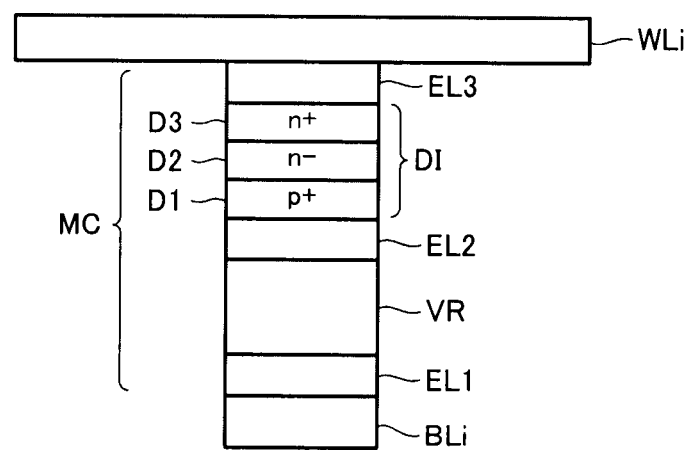
FIG. 3 is a cross-sectional view taken along the line I-I' in FIG. 2 and viewed in the direction of the arrows, showing one memory cell.

FIG. 2 is a perspective view of part of the memory cell array 1. FIG. 3 is a cross-sectional view taken along the line I-I' in FIG. 2 and viewed in the direction of the arrows, showing one memory cell. A plurality of word lines WL0-WL2 acting as first lines are arranged in parallel, a plurality of bit lines BL0-BL2 acting as second lines are arranged in parallel intersecting the word lines WL0-WL2, and a memory cell MC is disposed at each of intersections of these word lines WL0-WL2 and bit lines BL0-BL2 so as to be sandwiched by each of the word lines WL0-WL2 and bit lines BL0-BL2. The first and second lines are preferably made of a heat resistant and low resistance material, and may be made from the likes of W, WSi, NiSi, or CoSi. Note that in FIGS. 2-4, only three word lines WL and three bit lines BL are illustrated, but it goes without saying that the number of word lines WL and bit lines BL included in one memory cell array may exceed three.

[Memory Cell MC]

As shown in FIG. 3, the memory cell MC comprises a series-connected circuit of a variable resistance element VR and a diode DI. The variable resistance element VR may be configured from carbon (C), for example, although a substance that allows transition of its resistance value by application of a voltage may be adopted in place of carbon (C). As shown in FIG. 3, the diode DI is configured from a PIN diode comprising a p+ type layer D1, an n− type layer D2, and an n+ type layer D3, and is formed sandwiched between electrodes EL2 and EL3. The symbols "+" and "−" herein indicate magnitude of impurity concentration.

The following may be employed as a material of the electrode in electrodes EL1-EL3, namely, Pt, Au, Ag, TiAlN, SrRuO, Ru, RuN, Ir, Co, Ti, TiN, TaN, LaNiO, Al, PrIrOx, PtRhOx, Rh/TaAlN, W, and so on. In addition, a metal film to make orientation uniform may also be inserted. Moreover, a separate buffer layer, a barrier metal layer, an adhesive layer, and so on, may also be inserted.

[Modified Example of Memory Cell Array]

Figure 4:
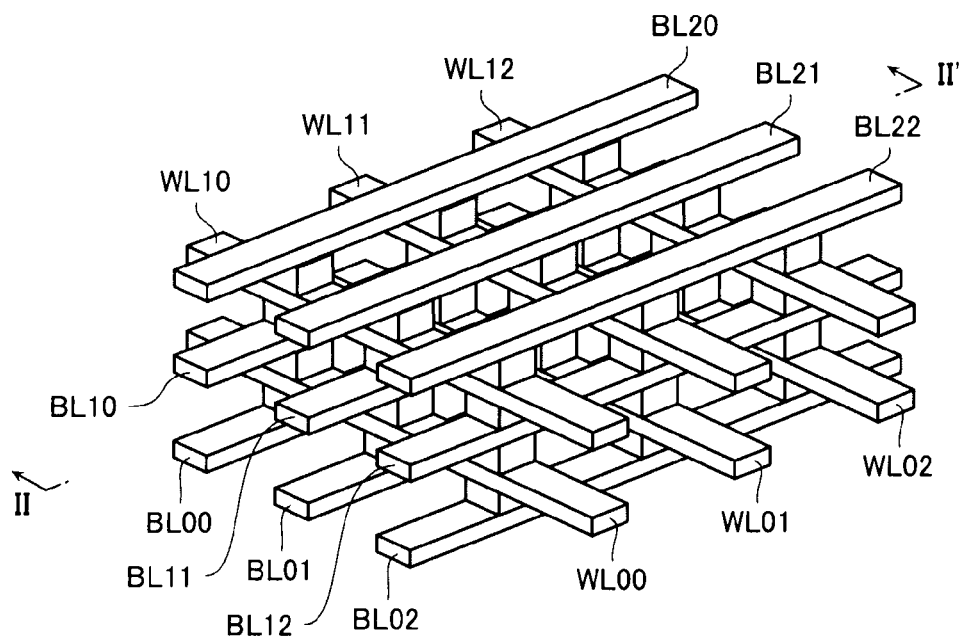
FIG. 4 shows an example of a separate configuration of the memory cell array 1.
Figure 5:
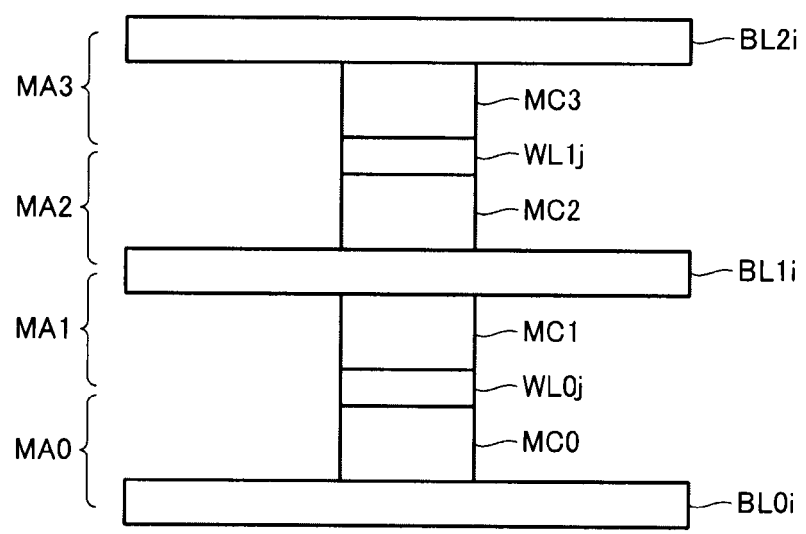
FIG. 5 shows the example of a separate configuration of the memory cell array 1.

In addition, as shown in FIG. 4, a three-dimensional structure may be adopted in which a plurality of the above-mentioned memory structures are stacked. FIG. 5 is a cross-sectional view taken along the line II-II' in FIG. 4. The example illustrated in FIG. 4 and FIG. 5 is a memory cell array having a four-layer structure configured from cell array layers MA0-MA3. A word line WL0$j$ is shared by memory cells MC0 and MC1 below and above the word line WL0$j$, a bit line BL1$i$ is shared by memory cells MC1 and MC2 below and above the bit line BL1$i$, and a word line WL1$j$ is shared by memory cells MC2 and MC3 below and above the word line WL1$j$.

In addition, a configuration may also be adopted in which an interlayer insulating film is interposed between cell array layers, such as line/cell/line/interlayer-insulating-film/line/cell/line, rather than repeating line/cell/line/cell in this way. Note that the memory cell array 1 may also be divided into several memory cell groups, that is, MATs. The aforementioned column control circuit 2 and row control circuit 3 may also be provided on a MAT basis, a sector basis, or a cell array layer MA basis, or may be shared by the MATs, sectors, or cell array layers MA. Moreover, they may be shared by a plurality of bit lines BL to reduce area.

Figure 6:
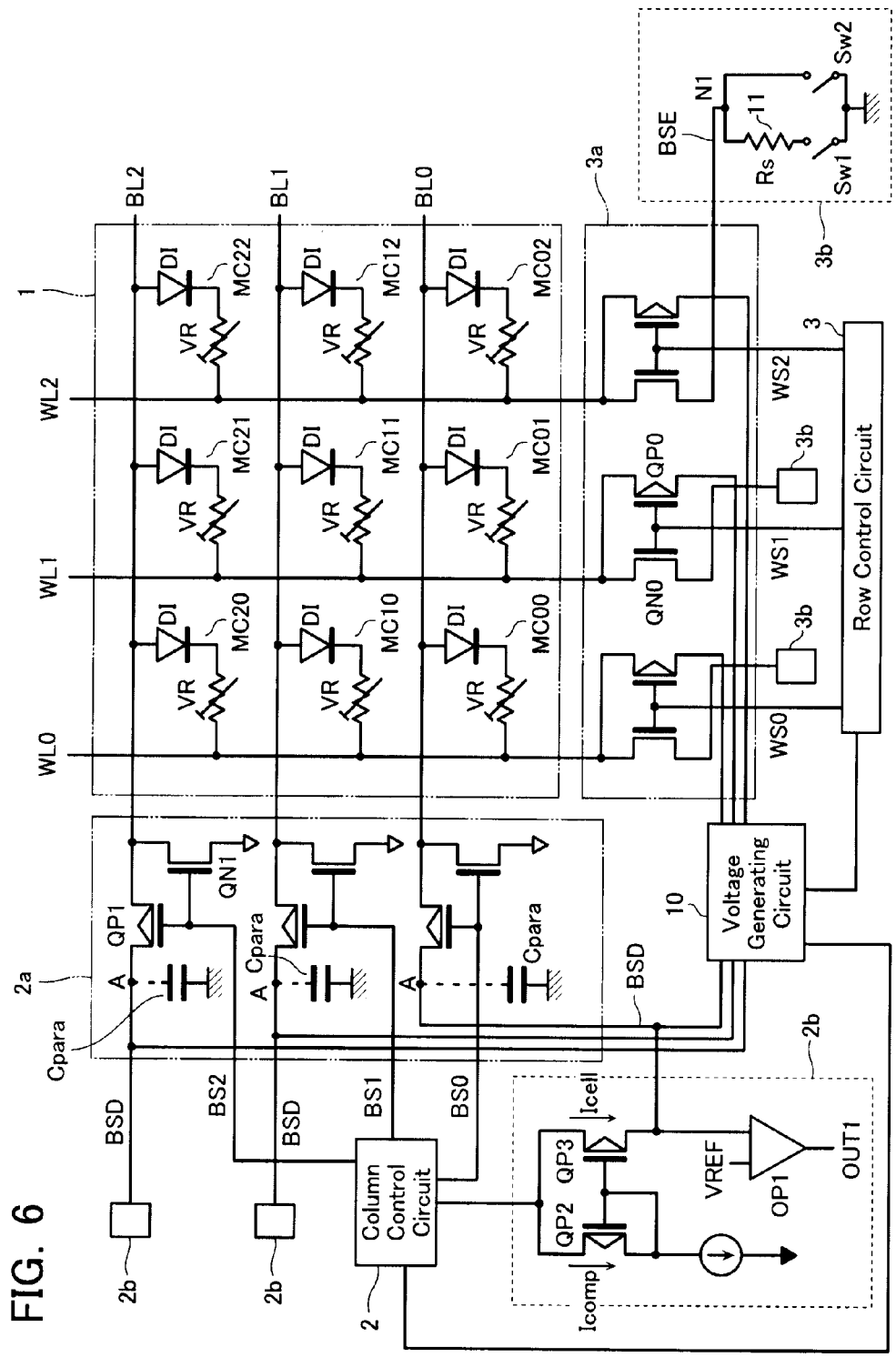
FIG. 6 is a circuit diagram of the memory cell array 1 and a peripheral circuit thereof.

FIG. 6 is a circuit diagram of the memory cell array 1 and a peripheral circuit thereof. In FIG. 6, the diode DI configuring the memory cell MC has its anode connected to the bit line BL and its cathode connected to the word line WL via the variable resistance element VR. One end of each of the bit lines BL is connected to a select circuit 2*a* which is part of the column control circuit 2. In addition, one end of each of the word lines WL is connected to a select circuit 3*a* which is part of the row control circuit 3.

The select circuit 2*a* is configured from a select PMOS transistor QP1 and a select NMOS transistor QN1 provided on a bit line BL basis and that have gates and drains commonly connected. The select PMOS transistor QP1 has its source connected to a respective drain side drive line BSD. The select NMOS transistor QN1 has its source connected to a ground terminal. Note that a sense amplifier circuit not shown, the drain side drive line BSD, the select circuit 2*a*, and the bit line BL have a parasitic capacitance Cpara. The drain side drive line BSD receives supply of a voltage required in operations from the voltage generating circuit 10.

The transistor QP1 and the transistor QN1 have their drains connected to the bit line BL and their gates supplied with a bit line select signal BSi that selects each of the bit lines BL.

In addition, the select circuit 3*a* is configured from a select PMOS transistor QP0 and a select NMOS transistor QN0 provided on a word line WL basis and that have gates and drains commonly connected. The select PMOS transistor QP0 has its source supplied with a certain voltage from the voltage generating circuit 10. The select NMOS transistor QN0 has its source connected to a ground terminal (ground voltage Vss) via a current suppression circuit 3*b* to be described later. The transistors QP0 and QN0 have their common drains connected to the word line WL and their common gates supplied with a word line select signal WSi from the row control circuit 3, the word line select signal WSi selecting each of the word lines WL.

Note that in the memory cell array 1, the polarity of the diode DI may be reversed compared to that of the circuit shown in FIG. 6 (connected such that a direction from the word line WL toward the bit line BL is a forward direction) thereby causing a current to flow from the word line WL side to the bit line BL side.

The column control circuit 2 comprises a current limiting circuit 2b shown in FIG. 6. This current limiting circuit 2b is a circuit to prevent a current Icell flowing in the memory cell MC from exceeding an upper limit value Icomp.

As an example, the current limiting circuit 2b comprises a current mirror circuit configured from PMOS transistors QP2 and QP3. The PMOS transistor QP2 is diode-connected and has its source connected to the column control circuit 2 and supplied with a constant current Icomp.

In addition, the PMOS transistor QP3 also has its source supplied with a certain constant voltage from the column control circuit 2. The PMOS transistor QP3 has its gate connected to the gate of the PMOS transistor QP2 and its drain connected to the drain side drive line BSD. This causes the current Icell flowing in the memory cell MC via the bit line BL and the drain side drive line BSD to be limited to a limit current Icomp or less.

Moreover, this current limiting circuit 2b comprises an OP amplifier (differential amplifier circuit) OP1. This OP amplifier OP1 has one input terminal connected to the drain side drive line BSD and the other input terminal provided with a reference voltage VREF from a constant voltage generating circuit not shown. When the current Icell flowing in the drain side drive line BSD increases, the OP amplifier OP1 amplifies a differential between a voltage of this drain side drive line BSD and the reference voltage VREF to output a differential amplifier signal OUT1.

On the other hand, the row control circuit 3 comprises, as a part thereof, a current suppression circuit 3b for suppressing a current flowing in the word line WL. This current suppression circuit 3b comprises a resistance element 11 (resistance value Rs) and switches Sw1 and Sw2. The switch Sw1 and the resistance element 11 are connected in series and form a first current path between a node N1 and a ground terminal. On the other hand, the switch Sw2 is connected between the node N1 and the ground terminal, and by that alone forms a second current path between the node N1 and the ground terminal. Therefore, a resistance value of the first current path formed by the switch Sw1 and the resistance element 11 is larger than a resistance value of the second current path formed by the switch Sw2.

During a setting operation and during a forming operation, the row control circuit 3 causes the switch Sw1 to be switched to a conductive state and the switch Sw2 to be switched to a non-conductive state. On the other hand, during a resetting operation and during a read operation, conversely, the switch Sw2 is switched to a conductive state and the switch Sw1 is switched to a non-conductive state. In such a way, the switches Sw1 and Sw2 are configured such that only one is selectively set to a conductive state and the other is set to a non-conductive state according to a kind of operation executed on the memory cell. As a result, during the setting operation and during the forming operation, the current flowing in the word line WL is suppressed.

The resistance element 11 may be inserted in the first current path only as shown in FIG. 6, or resistance elements may be inserted in both the first and second current paths. At that time, the resistance element inserted in the first current path needs only to have a resistance value larger than the resistance element inserted in the second path. Moreover, an element providing some kind of change in electrical resistance may be inserted in place of the resistance element.

[Operation of Nonvolatile Semiconductor Memory Device]

Next, the setting operation in the nonvolatile semiconductor memory device of the present embodiment is described by comparing with a comparative example.

Figure 7:
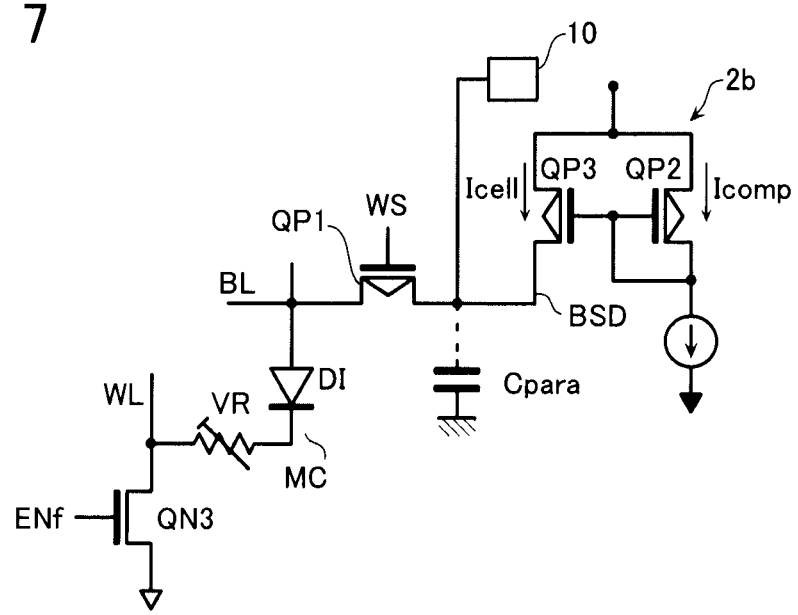
FIG. 7 is a circuit diagram showing part of a configuration of a nonvolatile semiconductor memory device according to a comparative example.

A circuit configuration of a nonvolatile semiconductor memory device according to the comparative example is shown in FIG. 7. The nonvolatile semiconductor memory device according to the comparative example differs from the nonvolatile semiconductor memory device according to the present embodiment in not including the current suppression circuit 3b. Note that configurative portions similar to those in the present embodiment are assigned with identical symbols, and descriptions thereof are omitted.

Figure 8:
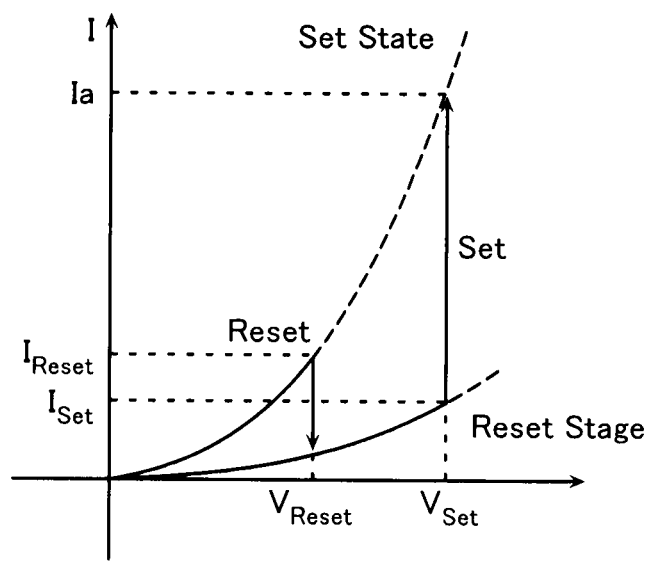
FIG. 8 is a view for explaining operation characteristics of the nonvolatile semiconductor memory device according to the comparative example.

FIG. 8 is a view showing current-voltage characteristics of the memory cell MC during the setting operation and during the resetting operation in the comparative example. The resetting operation is performed by applying a resetting voltage VReset to a memory cell MC in the low-resistance state (set state). When the memory cell MC achieves a reset state (high-resistance state), current flowing in the memory cell MC lowers abruptly.

Similarly, the setting operation is performed by applying a setting voltage VSet to a memory cell MC in the high-resistance state (reset state). When the memory cell MC achieves the set state (low-resistance state), the voltage VSet is applied between the bit line BL and the word line WL. Magnitude of the voltage VSet is large compared to that of the voltage VReset. Therefore, when the setting operation has been completed, current flowing in the memory cell MC increases sharply from ISet to Ia. Continuing to pass this current Ia for a long time has a risk of causing the above-described mistaken resetting operation and, in some cases, leads to damage being caused to the memory cell MC.

To solve such a problem, the nonvolatile semiconductor memory device in the comparative example includes the current limiting circuit 2b. The current limiting circuit 2b having the above-mentioned configuration allows the cell current Icell flowing from the bit line BL into the memory cell MC to be limited to the limit current Icomp or below.

However, a parasitic capacitance Cpara is present in the drive line BSD and the bit line BL. Charge is stored in the parasitic capacitance Cpara during the setting operation. When completion of the setting operation is detected and supply of the setting voltage VSet stops, the charge stored in the parasitic capacitance Cpara is also discharged via the memory cell MC and the word line WL.

However, if the parasitic capacitance Cpara is large, timing at which a potential of the node A lowers is delayed. This causes the potential of the node A to be maintained at a high potential for a long time even after supply of the setting voltage VSet has stopped. As a result, it may occur that a memory cell MC (variable resistance element VR) for which the setting operation has been completed and that has thus shifted from the high-resistance state to the low-resistance state ends up returning again to the high-resistance state (mistaken reset). It may occur in some cases that the memory cell MC is destroyed by this high voltage.

The nonvolatile semiconductor memory device according to the present embodiment includes the current suppression circuit 3b between the source of the transistor QN0 in the select circuit 3a (node BSE) and the ground terminal. The current suppression circuit 3b includes the resistance element 11 (resistance value Rs). Therefore, accompanying an increase in the cell current ISet when the setting operation is completed (amount of the increase assumed to be ΔI), the potential of the node BSE rises by an amount ΔI×Rs. As a result, the voltage applied to the memory cell MC can be decreased from VSet to VSet−ΔI×Rs, the sharp increase in current I flowing in the memory cell MC can be suppressed, and a mistaken resetting operation or destruction of the memory cell can thus be suppressed.

Note that the resistance value Rs of the resistance element 11 is determined to be in a range of from VSet/ISet to VReset/IReset.

Note that the potential of the node BSE gradually lowers along with discharge of the charge stored in the parasitic capacitance. Therefore, when the setting operation is performed simultaneously on a plurality of memory cells MC on an identical word line, the potential of the node BSE repeats rise and fall each time one memory cell MC is set.

As is clear from the above, the present embodiment makes it possible to provide a nonvolatile semiconductor memory device in which damage of the memory cells MC generated during the setting operation is prevented, and operation is performed stably.

Note that in the present embodiment, the column control circuit 2 and row control circuit 3 may also be configured capable of executing the setting operation or the forming operation simultaneously on a plurality of memory cells MC (n memory cells MC) along one word line WL.

Figure 9:
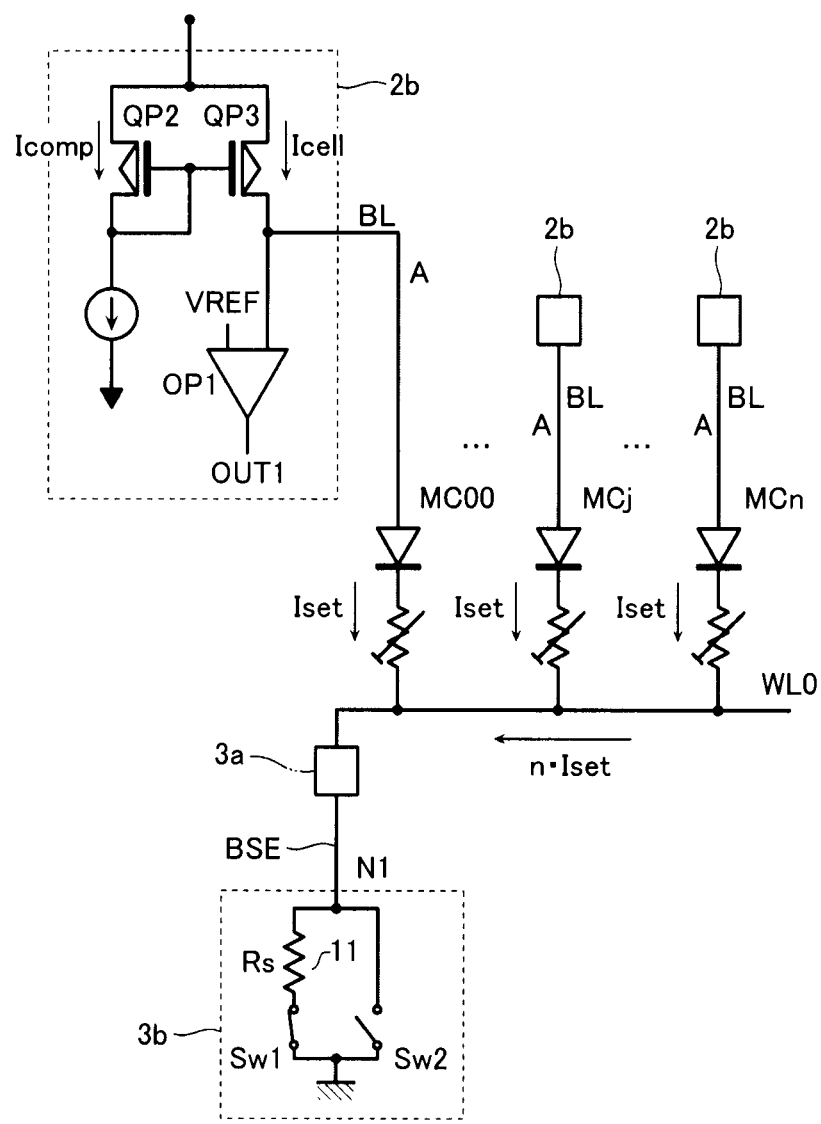
FIG. 9 is a circuit diagram for explaining operation of the nonvolatile semiconductor memory device according to the embodiment of the present invention.

FIG. 9 is a circuit diagram for explaining the situation when the setting operation is performed simultaneously on the n memory cells MC along one word line WL. When the forming operation commences, the cell current ISet is supplied from the current limiting circuit 2b to each selected memory cell. Therefore, the word line WL0 is supplied with a current n·ISet. The case where the setting operation of the i-th memory cell MCi (0<i<n) has been completed is now considered.

Normally, when performing the setting operation or the forming operation simultaneously on n memory cells MC in this way, timing at which the setting operation or the forming operation is completed in the n memory cells MC differs case-by-case.

When the setting operation of a certain memory cell MCi is completed causing the current in the memory cell MCi to increase, the potential of the node BSE rises due to action of the current suppression circuit 3b. Such a rise in potential of the node BSE leads to a lack of the voltage required in the setting operation in memory cells other than memory cell MCi, that is, in memory cells MCj (j≠i) in which the setting operation has not yet been completed. However, if the potential of the node A of the bit line BL to which the memory cell MCi is connected lowers, the raised potential of the node BSE starts to decrease again. Therefore, the present embodiment also acts effectively in a device configured to execute the setting operation or the forming operation simultaneously on n memory cells MC.

Second Embodiment

Figure 10:
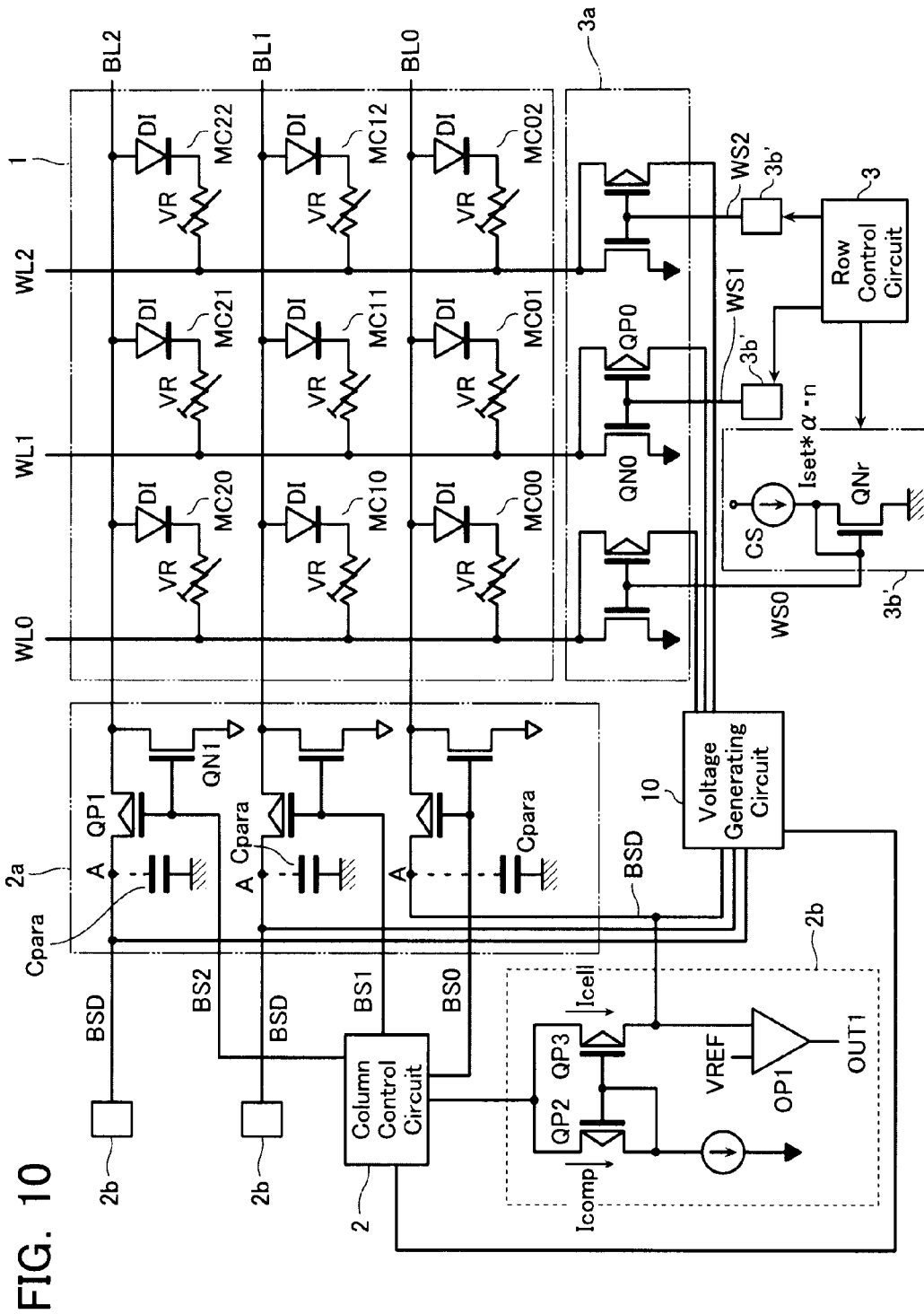
FIG. 10 is a circuit diagram of a memory cell array 1 and a peripheral circuit of the memory cell array 1 in a nonvolatile semiconductor memory device according to a second embodiment of the present invention.

Next, a second embodiment of the present invention is described with reference to FIG. 10. A nonvolatile semiconductor memory device in accordance with the second embodiment of the present invention is basically configured similarly to the nonvolatile semiconductor memory device according to the first embodiment, but has a different configuration of the current suppression circuit 3b. Note that portions configured similarly to in the first embodiment are assigned with identical symbols, and a detailed description of such portions is thus omitted.

A current suppression circuit 3b' according to the present embodiment includes an NMOS transistor QNr and a current source CS. The NMOS transistor QNr has the current source CS connected to its drain, and is supplied with a constant current ISet×α·n. In addition, the NMOS transistor QNr has its source grounded. Now, n indicates the number of memory cells MC in one word line WL that are simultaneously subjected to the setting operation or the forming operation. Moreover, α is a constant, and has a value of about 1.2-1.5, for example. The NMOS transistor QNr is diode-connected and has its gate connected to gates of the transistors QN0 and QP0. Note that when performing the setting operation or the forming operation simultaneously on the n memory cells MC along one word line WL, a value of n is gradually decreases as the setting operation progresses. For example, when performing the setting operation simultaneously on the memory cells MC00, MC01, and MC02, the number n of memory cells MC subject to the setting operation is three. Therefore, when the setting operation commences, a current ICS supplied from the current source CS is 3αISet. When the setting operation of the memory cell MC00 is completed, the number of memory cells MC subject to the setting operation decreases from three to two. Therefore, the current ICS decreases to 2αISet. Similarly, when the setting operation of the memory cell MC01 is completed, the current ICS decreases to αISet.

In this second embodiment, in the case that the setting operation or the forming operation is executed simultaneously on the n memory cells MC along one word line WL, when the setting operation or the forming operation on a certain memory cell MC is completed, the voltage of the word line WL rises. However, action of the current suppression circuit 3b' causes the current flowing in the transistor QN0 to be limited so as not to rise to any more than a certain value. As a result, when the setting operation or the forming operation of the certain memory cell MC is completed, the potential of the word line WL temporarily rises. This allows the present embodiment also to display similar advantages to those of the first embodiment.

Other

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
 a memory cell array having a first line, a second line, and a memory cell arranged therein, the memory cell being connected between the first line and the second line and including a variable resistance element;
 a control circuit configured to apply, via the first line and the second line, a voltage required in operation of the memory cell;
 a current limiting circuit connected to the first line and configured to limit a current flowing in the memory cell to a certain limit value; and
 a current suppression circuit configured connectable to the second line and configured to suppress a current flowing in the second line according to a kind of operation on the memory cell, wherein the current suppression circuit comprises:
- a first current path electrically connecting a ground terminal and the second line and having a first resistance value;
- a second current path electrically connecting the ground terminal and the second line and having a second resistance value; and
- a switch circuit configured to selectively switch the first current path and the second current path to a conductive state.

2. The nonvolatile semiconductor memory device according to claim 1, wherein
the control circuit is configured capable of executing a certain operation simultaneously on a plurality of the memory cells connected to one of the second lines.

3. The nonvolatile semiconductor memory device according to claim 1, further comprising:
a transfer transistor connected between the second line and the current suppression circuit and configured to be switched to a conductive state when the second line is selected.

4. The nonvolatile semiconductor memory device according to claim 1, further comprising:
a transfer transistor connected between the second line and a voltage terminal that supplies a certain voltage, and configured to be switched to a conductive state when the second line is selected,
wherein the current suppression circuit is configured to suppress a current flowing in the second line by controlling a voltage supplied to a gate of the transfer transistor.

5. The nonvolatile semiconductor memory device according to claim 1, wherein
given that a setting voltage applied between the first line and the second line during a setting operation which is an operation for changing the variable resistance element from a high-resistance state to a low-resistance state is VSet, a current flowing in the memory cell during the setting operation is ISet, a resetting voltage applied between the first line and the second line during a resetting operation which is an operation for changing the variable resistance element from the low-resistance state to the high-resistance state is VReset, and a current flowing in the memory cell during the resetting operation is IReset, then at least one of the first resistance value and the second resistance value is determined to be in a range of from VSet/ISet to VReset/IReset.

6. The nonvolatile semiconductor memory device according to claim 1, wherein
the first resistance value is larger than the second resistance value, and
the switch circuit is configured to switch the first current path to a conductive state during the setting operation.

7. A method of control in a nonvolatile semiconductor memory device, the nonvolatile semiconductor memory device including a memory cell array and a control circuit, the memory cell array having a first line, a second line, and a memory cell arranged therein, the memory cell being connected between the first line and the second line and including a variable resistance element, and the control circuit being configured to apply, via the first line and the second line, a voltage required in operation of the memory cell, the method of control comprising:
- limiting to a certain limit value a current flowing from the first line into the memory cell,
- suppressing a current flowing in the second line according to a kind of operation on the memory cell; and
- selectively switching a first current path or a second current path to a conductive state, the first current path electrically connecting a ground terminal and the second line and having a first resistance value, and the second current path electrically connecting the ground terminal and the second line and having a second resistance value.

8. The method of control in a nonvolatile semiconductor memory device according to claim 7, further comprising:
executing a certain operation simultaneously on a plurality of the memory cells connected to one of the second lines.

9. The method of control in a nonvolatile semiconductor memory device according to claim 7, wherein the nonvolatile semiconductor memory device further includes a transfer transistor which is connected between the second line and a current suppression circuit and is configured to be switched to a conductive state when the second line is selected, the current suppression circuit being configured to suppress a current flowing in the second line according to a kind of operation on the memory cell, the method of control further comprising:
suppressing a current flowing in the second line by controlling a voltage supplied to a gate of the transfer transistor.

10. The method of control in a nonvolatile semiconductor memory device according to claim 7, wherein
given that a setting voltage applied between the first line and the second line during a setting operation which is an operation for changing the variable resistance element from a high-resistance state to a low-resistance state is VSet, a current flowing in the memory cell during the setting operation is ISet, a resetting voltage applied between the first line and the second line during a resetting operation which is an operation for changing the variable resistance element from the low-resistance state to the high-resistance state is VReset, and a current flowing in the memory cell during the resetting operation is IReset, then at least one of the first resistance value and the second resistance value is determined to be in a range of from VSet/ISet to VReset/IReset.

11. The method of control in a nonvolatile semiconductor memory device according to claim 7, wherein
the first resistance value is larger than the second resistance value,
and further comprising:
switching the first current path to a conductive state during the setting operation.

12. A nonvolatile semiconductor memory device, comprising:
- a memory cell array having a first line, a second line, and a memory cell arranged therein, the memory cell being connected between the first line and the second line and including a variable resistance element;
- a control circuit for applying, via the first line and the second line, a voltage required in operation of the memory cell; and
- a current suppression circuit configured connectable to the second line and configured to suppress a change in current in the second line that occurs due to a change in resistance of the memory cell, wherein the current suppression circuit comprises:
- a first current path electrically connecting a ground terminal and the second line and having a first resistance value;
- a second current path electrically connecting the ground terminal and the second line and having a second resistance value; and
- a switch circuit for selectively switching the first current path and the second current path to a conductive state.

13. The nonvolatile semiconductor memory device according to claim 12, wherein
the control circuit is configured capable of executing a certain operation simultaneously on a plurality of the memory cells connected to one of the second lines.

14. The nonvolatile semiconductor memory device according to claim 12, further comprising:
a transfer transistor connected between the second line and the current suppression circuit and configured to be switched to a conductive state when the second line is selected.

15. The nonvolatile semiconductor memory device according to claim 12, further comprising:
a transfer transistor connected between the second line and a voltage terminal that supplies a certain voltage, and configured to be switched to a conductive state when the second line is selected,
wherein the current suppression circuit is configured to suppress the change in current in the second line by controlling a voltage supplied to a gate of the transfer transistor.

16. The nonvolatile semiconductor memory device according to claim 12, wherein
given that a setting voltage applied between the first line and the second line during a setting operation which is an operation for changing the variable resistance element from a high-resistance state to a low-resistance state is VSet, a current flowing in the memory cell during the setting operation is ISet, a resetting voltage applied between the first line and the second line during a resetting operation which is an operation for changing the variable resistance element from the low-resistance state to the high-resistance state is VReset, and a current flowing in the memory cell during the resetting operation is IReset, then at least one of the first resistance value and the second resistance value is determined to be in a range of from VSet/ISet to VReset/IReset.

17. The nonvolatile semiconductor memory device according to claim 12, wherein
the first resistance value is larger than the second resistance value, and
the switch circuit switches the first current path to a conductive state during the setting operation.

* * * * *